(12) United States Patent  
Yamazaki (10) Patent No.: US 7,397,180 B2  
(45) Date of Patent: Jul. 8, 2008

(54) LIGHT EMITTING DEVICE HAVING A CONDUCTIVE POLYMER AND COLORING LAYERS

(75) Inventor: Shunpei Yamazaki, Setagaya (JP)

(73) Assignee: Semiconductor Energy Laboratory Co., Ltd.

( * ) Notice: Subject to any disclaimer, the term of this patent is extended or adjusted under 35 U.S.C. 154(b) by 0 days.

(21) Appl. No.: 11/205,083

(22) Filed: Aug. 17, 2005

(65) Prior Publication Data

US 2006/0028131 A1     Feb. 9, 2006

Related U.S. Application Data

(63) Continuation of application No. 10/357,332, filed on Feb. 4, 2003, now Pat. No. 6,933,520.

(30) Foreign Application Priority Data

Feb. 13, 2002     (JP)     ............................. 2002-034919

(51) Int. Cl.  
   *H01J 1/62*     (2006.01)  
   *H01J 63/04*    (2006.01)

(52) U.S. Cl. ................... 313/506; 313/504; 313/509; 315/169.3; 257/40

(58) Field of Classification Search ......... 313/498–506, 313/292, 509; 315/169.3; 257/40  
See application file for complete search history.

(56) References Cited

U.S. PATENT DOCUMENTS 5,818,550 A    10/1998   Kadota et al.

| 6,002,462 A | 12/1999 | Sato et al. |
| 6,011,274 A | 1/2000 | Gu et al. |
| 6,031,512 A | 2/2000 | Kadota et al. |
| 6,091,196 A * | 7/2000 | Codama ................. 313/504 |
| 6,153,893 A | 11/2000 | Inoue et al. |
| 6,365,916 B1 | 4/2002 | Zhong et al. |
| 6,372,558 B1 | 4/2002 | Yamanaka et al. |
| 6,512,504 B1 * | 1/2003 | Yamauchi et al. ........ 315/169.3 |
| 6,515,428 B1 | 2/2003 | Yeh et al. |

(Continued)

OTHER PUBLICATIONS

Office Action (Application No. 200310003860.3) dated Sep. 7, 2007.

*Primary Examiner*—Peter Macchiarolo  
(74) *Attorney, Agent, or Firm*—Eric J. Robinson; Robinson Intellectual Property Law Office, P.C.

(57) ABSTRACT

It is considered that in the fabricating steps of a TFT substrate, a color filter layer is prepared at the same alignment accuracy. However, since the heat resistance temperature is about 200° C., it could not withstand the process temperature of about 450° C. in the TFT. The pixel section is formed by arraying in a matrix shape a light emitting element in which an organic compound layer having the luminous property is formed between a pair of electrodes consisting of a translucent electrode and a non-translucent electrode and a TFT, the coloring layer of color filter provided corresponding to each pixel is provided in contact with the flat surface of the flattened insulating film composed of an inorganic or organic material between the light emitting element and the TFT, the boundary region of coloring layers adjacent each other is provided while overlapping with a gate signal line or data line for transmitting a signal to the TFT, and the translucent electrode is provided while overlapping with the layer inside of the coloring layer.

22 Claims, 7 Drawing Sheets

U.S. PATENT DOCUMENTS

| | | |
|---|---|---|
| 6,522,066 B2 | 2/2003 | Sheu et al. |
| 6,528,951 B2 * | 3/2003 | Yamazaki et al. ........ 315/169.3 |
| 6,548,960 B2 * | 4/2003 | Inukai .................... 315/169.3 |
| 6,633,121 B2 * | 10/2003 | Eida et al. ................... 313/504 |
| 6,689,492 B1 * | 2/2004 | Yamazaki et al. ........... 313/502 |
| 6,936,962 B2 * | 8/2005 | Hamada et al. ............. 313/506 |
| 2001/0025958 A1 | 10/2001 | Yamazaki et al. |
| 2001/0026127 A1 | 10/2001 | Yoneda et al. |
| 2001/0055841 A1 * | 12/2001 | Yamazaki et al. ........... 438/151 |
| 2002/0047568 A1 * | 4/2002 | Koyama ................... 315/169.3 |
| 2003/0057419 A1 * | 3/2003 | Murakami et al. ............. 257/72 |
| 2003/0146712 A1 * | 8/2003 | Inukai ..................... 315/169.3 |

* cited by examiner

LIGHT EMITTING DEVICE HAVING A CONDUCTIVE POLYMER AND COLORING LAYERS

BACKGROUND OF THE INVENTION

1. Field of the Invention

The present invention relates to a method of preparing a light emitting device equipped with a light emitting element having a layer composed of an organic compound (hereinafter, referred to as organic compound layer), and particularly relates to a multi-color display function.

2. Prior Art

Since a spontaneous emission type display device using a light emitting element in which an organic compound layer is intervened between a pair of electrodes has a wide angular field of view and is also excellent in visibility, it has drawn the attention as a display device of the next generation.

A light emitting mechanism of a light emitting element is considered as the phenomenon that a hole injected from an anode which is one of a pair of electrodes and an electron injected from a cathode which is the other one of a pair of electrodes recombine in a luminescent organic compound layer (light emitting layer) and form an exciton, and the exciton emits the light at the time when the exciton returns to the ground state. The emission is referred to as electroluminescence. The electroluminescence includes fluorescence and phosphorescence, that is, these are emission (fluorescence) from the singlet state in the excited state and emission (phosphorescence) from the triplet state. Since the brightness due to the emission ranging from several thousands to several tens of thousands cd/m$^2$, in principle, it is considered to be capable of being applied to a display device or the like.

In such a light emitting element, an organic thin film is usually formed in a thin film less than 1 μm. Moreover, since the light emitting element is a spontaneous emission type element in which the organic thin film itself emits the light, it is not necessary to be equipped with a back light used in the conventional liquid crystal display. Therefore, it is a big advantage that a light emitting element can be easily prepared in an extremely thin type and light weight.

Moreover, a method referred to as an active matrix drive has realized a high definition image display without any crosstalk by providing a thin film transistor (TFT) per each pixel and controlling an individual emission of the light emitting element.

In a method of displaying in colors, a method in which the materials or additives of the light emitting layers are made different and luminous colors per each pixel which are made different in red, green and blue are arrayed and a method in which a light emitting element for emitting white color light is used and combined with color filters and the like have been known.

However, when the color filter and pixel matrix in which a light emitting element is provided in each pixel are individually formed, it is necessary to align both with a high accuracy and assemble them, and in the case where the alignment accuracy is low, there has been a problem that the actual aperture efficiency is lowered.

Needless to say, it is also considered that in the fabrication steps of a TFT substrate, the colored layers of the color filters are prepared with the same alignment accuracy. However, since the heat resistance temperature is about 200° C., the process temperature of about 450° C. in the TFT could not be withstood.

Moreover, a material referred to as a color resist used at the time when the colored layers of the color filters are formed is considerably expensive material, and there has been a problem that such a process in which the yield of TFT steps and color filter steps are integrated is a factor of increasing the fabricating cost and thus is not suitable.

SUMMARY OF THE INVENTION

The present invention can solve such problems, and an object of the present invention is to provide a light emitting device capable of realizing a high definition and reducing the fabricating cost.

In order to solve the above-described problems, a configuration of the present invention is a light emitting device having a TFT on the substrate, coloring layers of color filters and a light emitting element in which an organic compound layer having a luminescent property between a pair of electrodes is formed, the coloring layers of color filters are formed on a flat surface of an insulating film formed with inorganic or organic material on the TFT, and the emission of the light element is irradiated through the relevant coloring layers.

According to the present invention, a flattened insulating film composed of an inorganic or organic material covering TFT formed on the substrate is formed, the coloring layer of color filter is provided on the flat surface of the insulating film, a light emitting element in which an organic compound layer having the luminous property is formed between a pair of electrodes is provided on the coloring layer, and the emission of the light emitting element is irradiated through the coloring layer.

According to the present invention, a flattened insulating film composed of an inorganic or organic material for covering a TFT formed on the substrate, a coloring layer of color filter is provided on the flat surface of the insulating film, a light emitting element in which an organic compound layer having the luminous property is formed between a pair of electrodes is provided on the coloring layer, and the TFT and the light emitting element are electrically connected through the wiring penetrating through the insulating film and the coloring layer, and the emission of the light emitting element is irradiated through the coloring layer.

According to the present invention, a pixel section is formed by arraying in a matrix shape light emitting elements in which an organic compound layer having the luminous property between a pair of electrodes and TFTs, coloring layers of color filters provided corresponding to the respective pixels is provided in contact with the flat surface of the flattened insulating film composed of an inorganic or organic material between a light emitting element and a TFT, the boundary region of the adjacent coloring layers is provided while overlapping with a gate signal line or a data line for transmitting a signal to the TFT.

According to the present invention, a pixel section in which light emitting elements in which an organic compound layer having the luminous property between a pair of electrodes composed of a translucent electrode and a non-translucent electrode and TFTs are arrayed in a matrix shape is formed, coloring layers of color filters provided corresponding to the respective pixels is provided in contact with the flat surface of the flattened insulating film composed of an inorganic or organic material between the light emitting element and the TFT, the boundary region of the adjacent coloring layers is provided while overlapping with a gate signal line or a data signal line for transmitting a signal to the TFT, and the translucent electrode is provided while overlapping with the layer inside of the coloring layer.

A flattened insulating film composed of an inorganic or organic material is formed with an inorganic insulating film such as silicon oxide or polyimide, acryl and the like. A coloring layer may be formed on this flattened insulating film, or an inorganic insulating film such as silicon nitride may be made intervened between them. On the coloring layer of the color filter, a translucent electrode (anode) formed per each pixel as an individual electrode is formed. Moreover, an inorganic insulating film such as silicon nitride film or the like may be formed between this translucent electrode (anode) and the coloring layer.

In a light emitting element, an organic compound layer is laminated by making this translucent electrode (anode) as one of the electrodes, and further, the other electrode opposing to the translucent electrode (anode) is formed on the upper layer. The emission is irradiated from the side of the translucent electrode (anode) by making it in a structure of the light emitting element. In other words, the light can be taken out toward the exterior by making it transmit through the coloring layer of color filter.

The boundary region of the adjacent coloring layers is provided at the position where it is overlapped with a gate signal line or a data signal line provided and arranged in the pixel section, the wirings are capable of being utilized as a light-shielding film, and the aperture efficiency can be enhanced.

An organic compound layer is a structure in which a hole injection transport layer located on the anode side or an electron injection transport layer located on the cathode side, a light emitting layer and the like are appropriately combined. The hole injection transport layer or electron injection transport layer draw the attention as it is considered that the injection efficiency of holes or electrons from an electrode and transportation property (mobility) are particularly important, and further, a luminous electron injection transport layer also equipped with a function as a light emitting layer or the like may be combined.

As an organic compound for forming these respective layers, both a short chain organic compound and a polymer molecular organic compound are known. As for an example of a short chain based organic compound, as a hole injection transport layer, α-NPD (4,4'-bis-[N-(naphtyl)-N-phenyl-amino]biphenyl) which is cupper phthalocyanine (CuPc) aromatic amine based material and MTDATA (4,4',4"-tris(N-3-methylphenyl-N-phenyl-amino)triphenylamine) are known, as an electron injection transport layer or luminous electron injection transport layer, tris-8-quinolinolato aluminum complex ($Alq_3$) and the like are known. As a polymer molecule based organic light emitting material, polyaniline, polythiophene derivative (PEDOT) and the like are known.

As for a coloring layer of color filter, a pigment or die in a resin binder is dispersed, and that is formed by a coating method, and then it is formed into a predetermined pattern using a light exposure step. In this case, the respective coloring layers can be arrayed with a high alignment accuracy by forming a coloring layer of color filter per each color on the flattened surface composed of an inorganic or organic material.

Moreover, as for a coloring layer pattern-formed with a water soluble alkali developer, the semiconductor film is not polluted by alkali component, pigment, die or the like by means of arraying these prior to the formation of contact hole on the flattened insulating layer.

Moreover, the present invention can prevent the components such as pigment and the like contained in the coloring layer from diffusing to the TFT side by intervening an inorganic insulating film such as silicon nitride between the flattened film and the coloring layer. Moreover, the present invention can prevent the components such as pigment and the like contained in the coloring layer from diffusing to the light emitting element side by forming an inorganic insulating film such as silicon nitride film between this translucent electrode (anode) and the coloring layer.

Moreover, the surface of the coloring layer of color filter may be polished and flattened. By thus performing, the yield of the color filter can be enhanced and at the same time, the flatness of the surface of the translucent electrode (anode) can be enhanced, and the short circuit of the light emitting element can be prevented.

In any case, a pin hole test of the coloring layer can be carried out at this stage by forming the coloring layer of the color filter on the flattened layer, and in the case where it does not reach the predetermined standard, the coloring layer is peeled off and reprocessing can be done. As a method of peeling off, it may be washed and removed by a solvent, or it may be also mechanically polished and cut out. In any case, since the flattened film exists there, the reprocessing can be provided without damaging the TFTs.

DESCRIPTION OF THE PREFERRED EMBODIMENTS

Figure 5:
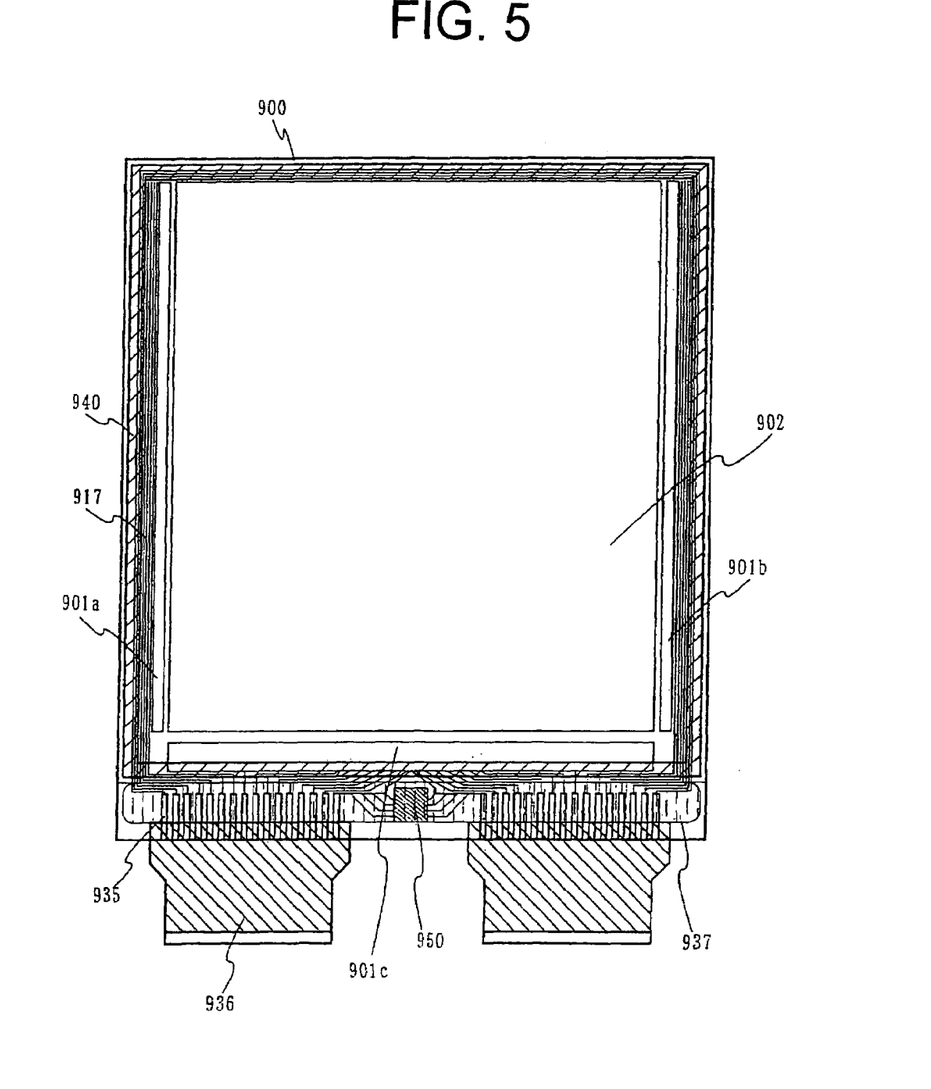
FIG. 5 is a top view showing the configuration of a light emitting device.

Hereinafter, Embodiments of the present invention will be described in detail with reference to the drawings. In FIG. 5, one form of a light emitting device in which a substrate 900 is equipped with a pixel section 902, gate signal side drive circuits 901a, 901b, a data signal side drive circuit 901c, an input and output terminal section 935 and a wiring or wiring group 917 is shown. A sealing pattern 940 may be partially overlapped with the gate signal line side drive circuits 901a, 901b, the data signal line side drive circuit 901c and the wiring or wiring group 917 connecting the relevant drive circuit section and an input terminal. By thus performing, the area of the frame region of the display panel (peripheral region of pixel section) can be diminished. A FPC 936 is attached to and fixed on the exterior input terminal section.

Figure 6:
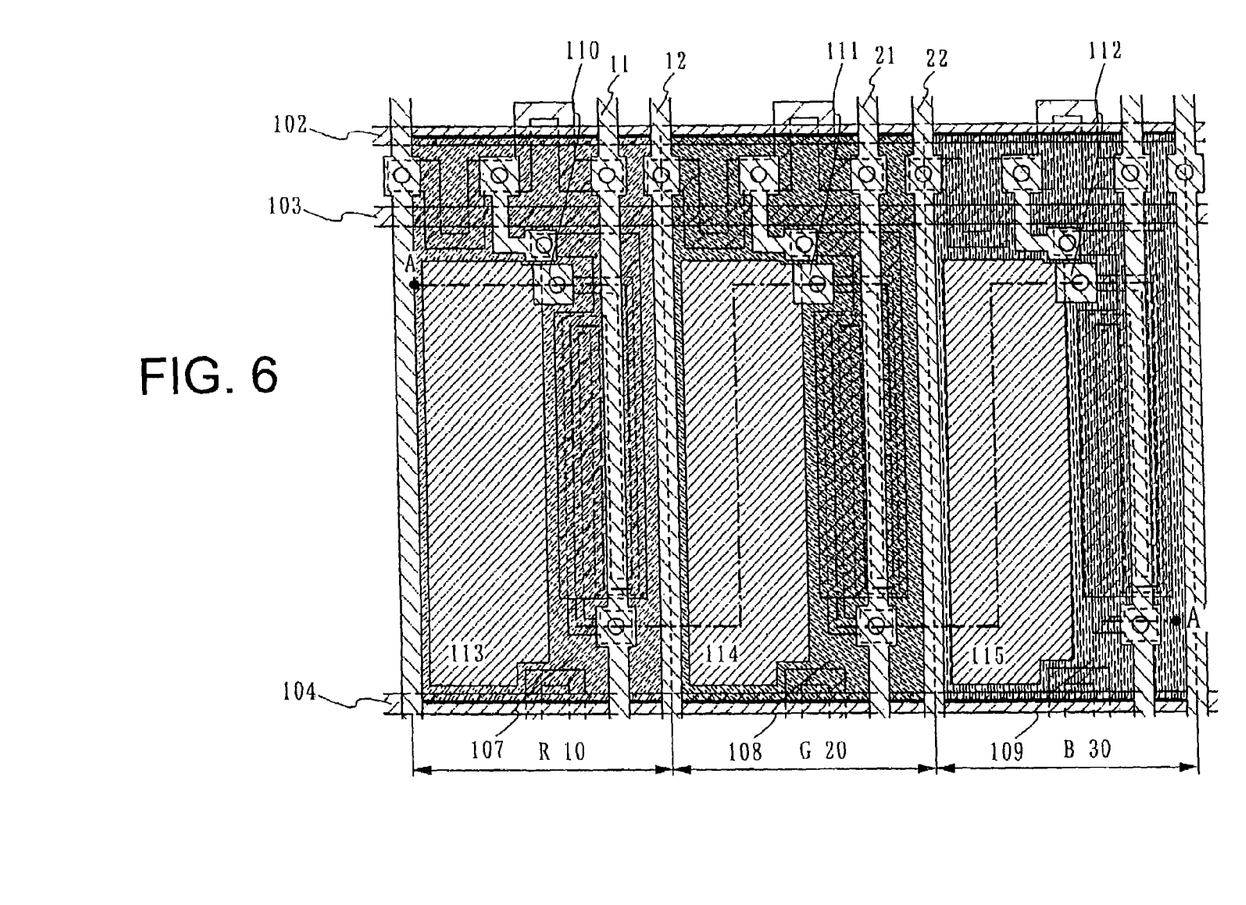
FIG. 6 is a top view showing the configuration of a pixel of a light emitting device equipped with a color filter coloring layer of the present invention.

In the pixel section 902, a TFT and a light emitting element are provided per each pixel, and these are arrayed in a matrix shape and thus configured. The top view of the pixel is shown in FIG. 6. It should be noted that in FIG. 6, for the purpose of illustration, the respective layers and barrier layer in which light emitting elements are formed are omitted.

Figure 7:
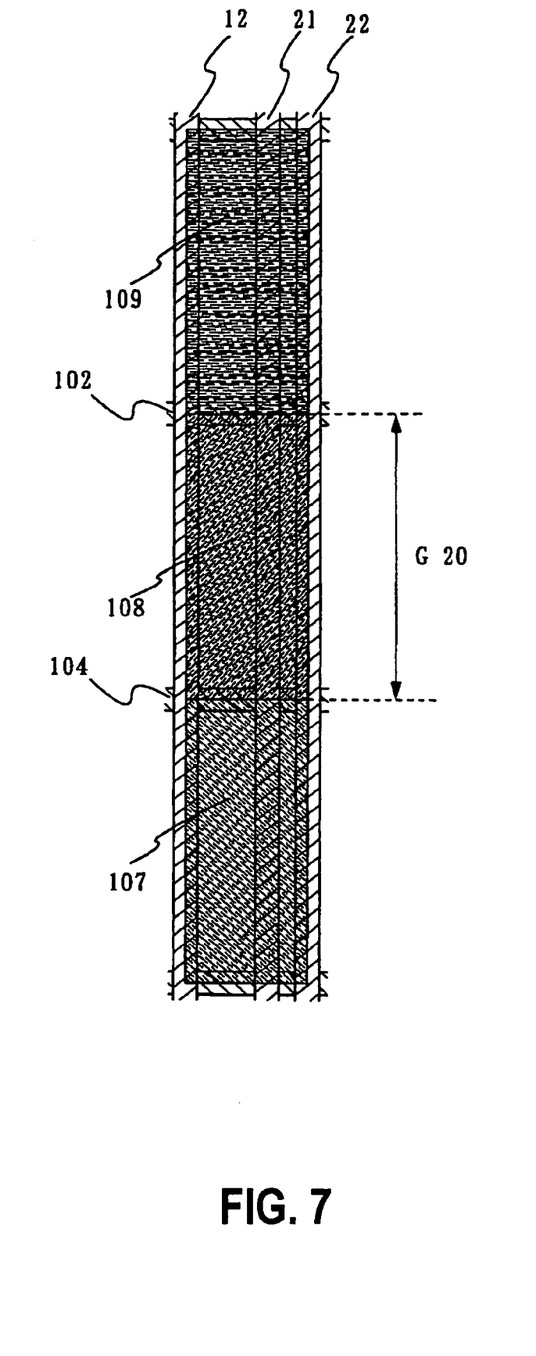
FIG. 7 is a top view showing the configuration of a pixel of a light emitting device equipped with a color filter coloring layer of the present invention.

In FIG. 6, the array of R pixel 10, G pixel 20 and B pixel 30 which is one example of pixel array by which the color display of R (red), G (green) and B (blue) is performed is shown. In the respective pixel, TFTs 13, 23 and 33 translucent electrodes (anodes) 113-115 connected to TFTs through wirings 110-112 are provided. The coloring layers 107-109 of color filters (R filter 107, G filter 108, B filter 109) are located above the gate signal lines (scanning signal lines) 102-104, formed in the lower layer side than the data signal lines 11, 12, 21, 22 and 31. Then, the boundary region of the respective adjacent coloring layers are provided while overlapping with the gate signal line and the data signal line. In FIG. 6, the boundary region of the respective adjacent coloring layers 107, 108, and 109 are provided while overlapping with the data signal lines 12, and 22. The top view of the pixel is shown in FIG. 7. In FIG. 7, the boundary region of the respective adjacent coloring layers 107, 108, and 109 are provided while overlapping with the gate signal lines 102, and 104.

Moreover, the translucent electrodes 113-115 are provided while overlapping with the layer inside of the respective coloring layers 107-109. In this pixel structure, a longitudinal sectional view taken on line A-A' is shown in FIG. 1.

Figure 1:
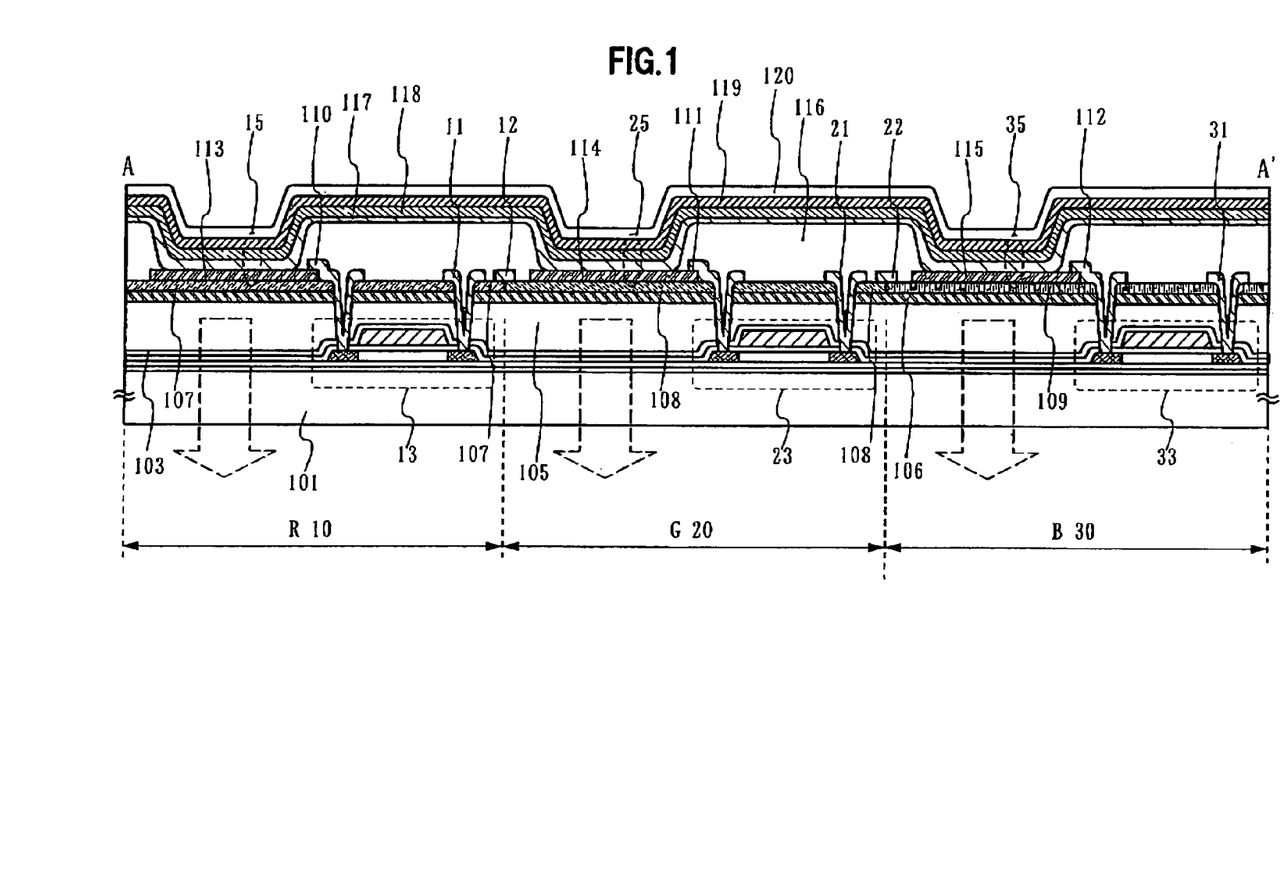
FIG. 1 is a vertical section showing the configuration of a light emitting device equipped with a color filter coloring layer of the present invention.

In FIG. 1, the R pixel 10, G pixel 20 and B pixel 30 are equipped with the TFTs 13, 23, 33 and the light emitting elements 15, 25 and 35, between them, and the flattened insulating film 105 formed with an inorganic or organic material is formed. The flattened insulating film 105 has a flat surface, the coloring layers 107-109 of color filter are formed on the surface. As for the coloring layers of color filter, the pigment or die has been dispersed in a resin binder and that is formed by a coating method, and then it is formed in the predetermined pattern using a light exposure step.

The insulating film 106 with barrier property such as silicon nitride or the like has been previously formed between the coloring layers 107-109 and the flattened insulating film 105. Owing to this, the components such as pigment and the like contained in the coloring layer can be prevented from diffusing to the TFT side. Moreover, when the pattern formation is carried out with an alkali aqueous developer, the present invention can prevent the flattened insulating film 105 and the TFTs of the lower layers from deteriorating by the alkali component. Furthermore, the respective coloring layers can be arrayed with a high alignment accuracy by forming the coloring layers of color filter per each color on the flattened surface composed of an inorganic or organic material. It should be noted that the insulating film with barrier property which is referred to herein has a function for interrupting ionic impurities, moisture, metal impurities, alkali metal and the like and inhibiting the diffusion of these.

Moreover, the inorganic insulating film 103 formed with the material selected from silicon nitride, silicon oxynitride, aluminum nitride and aluminum oxynitride is formed. Owing to this, the present invention can prevent the component of the coloring layers of color filter and the like from diffusing within the TFT.

The light emitting elements 15, 25 and 35 are elements in which the organic compound layer 118 having the luminous property is formed between the translucent electrodes (anodes) 113-115 and the non-translucent electrode (cathode) 119. The translucent electrodes (anodes) 113-115 are formed with translucent conductive film such as indium tin oxide (ITO), zinc oxide (ZnO), indium zinc oxide (IZO) and the like by a resistance heating vapor deposition. The non-translucent electrode (cathode) 119 is formed with fluorides of an alkali metal or alkaline earth metal.

An organic compound layer can have a variety of configurations, but it is a structure in which a hole injection transport layer located on the anode side, an electron injection transport layer located on the cathode side, a light emitting layer and the like are combined. The hole injection transport layer or electron injection transport layer draw the attention as it is considered that the injection efficiency of holes or electrons from an electrode and transportation property (mobility) are particularly important, and further, a luminous electron injection transport layer also equipped with a function as a light emitting layer or the like may be combined.

Although these organic light emitting medium or the respective organic layers may be formed with one species or a plurality of species of organic materials, it may also be formed with the mixture of an organic light emitting material and a material with electron injection transport property or hole injection transport material, a polymer molecular material in which the relevant mixture or an organic light emitting material or a metal complex is dispersed, and the like.

As an organic compound for forming these respective layers, both a short chain based organic compound and a polymer molecule base organic compound are known. As for an example of a short chain based organic compound, as a hole injection transport layer, α-NPD (4,4'-bis-[N-(naphtyl)-N-phenyl-amino]biphenyl) which is cupper phthalocyanine (CuPc) aromatic amine based material and MTDATA (4,4', 4"-tris(N-3-methylphenyl-N-phenyl-amino)triphenylamine) are known, as an electron injection transport layer or luminous electron injection transport layer, tris-8-quinolinolato aluminum complex ($Alq_3$) and the like are known. As a polymer molecule based organic compound material, polyaniline, polythiophene derivative (PEDOT) and the like are capable of being applied.

In the case where the light emitting layer is formed with a polymer molecule based organic compound material, $\pi$ conjugated system material is used. As a representative material, polyparaphenylene vinylene (PPV) based material, polyvinylcarbazole (PVK) based material, polyfluorene based material and the like are listed. Concretely, cyanopolyphenylene vinylene may be used for R pixel, cyanopolyphenylene vinylene may be used for G pixel, cyanopolyphenylene vinylene or polyalkylphenylene may be used for B pixel may be used. It should be noted that the above-described materials are examples capable of being applied to a light emitting layer, so it is not necessary to be limited to these. Needless to say, a light emitting layer may be formed with a material which emits white color.

Methods of obtaining white color emission include a method in which the light emitting layer for emitting the respective colors of R (red), G (green) and B (blue) which are the three primary colors are laminated and the additive mixture of color is carried out, and a method of utilizing the relationship of two complementary colors. In the case where the complementary color is used, the combination of blue-yellow or bluish green-orange is known. It is considered that particularly, the latter is more advantageous since the emission in the wavelength region having a comparatively high visual sensitivity can be utilized.

An example of a light emitting element which exhibits white color emission is a structure in which an electron injection transport layer, a red color light emitting layer, a green color light emitting layer, a hole transport layer, a blue color light emitting layer and the second electrode are laminated between a pair of cathode and anode. As a hole transport layer, 1,2,4-triazole derivative (p-EtTAZ), as a green color light emitting layer, tris (8-quinolinolato)aluminum ($Alq_3$) is used, and as a blue color light emitting layer, the emission of bluish green color in which the blue color of TPD and the green color of $Alq_3$ are mixed is used. In order to realize white color emission by adding red color to this emission, either Alq$_3$ or TPD may be doped with red color light emitting pigment for red color light emitting layer. As a red color light emitting pigment, Nile red or the like can be applied to this.

Moreover, as other configurations, an electron injection transport layer, an electron transport layer, a light emitting layer, a hole transport layer and a hole injection transport layer can be formed. In this case, referring to the combination of suitable materials, as an electron injection transport layer, Alq$_3$ is used, as an electron transport layer, phenylanthracene derivative is formed. The light emitting layer is constituted so that a first light emitting layer in which tetraarylbenzidine derivative and phenylanthracene derivative are mixed at the volume ratio of 1:3 and 3% by volume of styryl amine derivative is contained, a second light emitting layer in which tetraarylbenzidine derivative and 10,10'-bis[2-bephenylyl]-9,9'-bianthryl (phenylanthracene derivative) are mixed at the volume ratio of 1:3 and 3% by weight of naphthacene derivative is contained are laminated. For the hole transport layer, N,N,N',N'-tetrakis-(3-biphenyl-1-yl)benzidine (tetraarylbenzidine derivative) is formed, as a hole injection layer, N,N'-diphenyl-N,N'-bis[N-phenyl-N-4-tolyl (4-aminophenyl)] benzidine is formed.

Moreover, as for other configurations, it is configured that as an electron injection transport layer, Alq$_3$ whose electron transportation property is high is used, and on which, a polymer molecule based organic light emitting medium is used, and TAZ and PVK (poly(N-vinylcarbazole)) are formed into a layer, thereby making it a three-layer structure. The recombination of injected electron and hole occurs in PVK, carbazole group having a peak at a short wavelength is excited and emits the light. When doping a suitable pigment into this in order to add the emission of a long wavelength light, white color emission can be obtained. For example, by doping 2-3 mol % of 1,1,4,4-tetraphenyl-1,3-butadiene (TPB), the emission at 450 nm is obtained, green color and red color can be also obtained by doping coumarin 6 and DCM1. In any case, in order to obtain white color emission, the whole of visible light region may be covered by doping a variety of kinds of pigments in PVK. In this structure, an inorganic electron injection transport layer may be also used for the electron injection transport layer 203. As an inorganic electron transport layer, diamond like carbon (DLC) which has been made n-type can be applied. In order to make DLC film n-type, it may be available to appropriately dope phosphorus and the like. Besides these, one species of oxides selected from an alkali metal element, an alkaline earth metal element, and an element of lanthanoide series, and one species or more of inorganic materials selected from Zn, Sn, V, Ru, Sm and In can be applied.

Moreover, as other configurations, it may be also configured so that a hole injection transport layer consisting solely of 4,4'-bis-[N-(naphthyl)-N-phenyl-amino] biphenyl (α-NPD) is formed, and on which, a light emitting layer in which α-NPD and BAlq which is a material having an electron transportation property have been mixed is formed, on which, an electron injection transport layer consisting solely of BAlq is formed. Since this light emitting layer emits blue color light, as a second light emitting material, a region into which rubrene, yellow fluorescent pigment, has been added is formed. Owing to this, white color emission can be obtained.

In any case, in order to make visually natural white color emission and multi-color display with a higher quality, it is required that the coloring balance has to be considered by optimizing the combination of an organic light emitting element for emitting the respective colors and a color filter. Moreover, it is required to do something for convenience sake by the drive circuit side corresponding to the case where the emission brightness changes with time.

In a method of utilizing the relationship of two additive complementary colors, since the combination of blue-yellow color or bluish green-orange color is usually applied, there is a problem that the coloring balance is broken by deterioration due to the change of the organic light emitting elements for emitting the respective colors of light with time. Moreover, since the emission efficiencies of the respective organic light emitting element are different, there is a problem that the coloring balance is broken if the same drive voltage or drive current is applied.

There is a method in which, usually, the thickness of the coloring layer of color filter is changed and the transmitting light amount is controlled, or a method in which the area of the pixel is changed and the light amount is controlled. However, in the case where the thickness of the coloring layer is changed, it is necessary to change its thickness at a ratio of several μm. If it is fixed as an opposing substrate, it is necessary to thicken the flattened film or thicken the thickness of the sealing member, and in this case, there is a fear that the reliability of the sealing structure is damaged. Moreover, in the case where the area of the pixel is changed, since there is a limitation on the arrangement of the TFTs and its size, it is adversely affected by the fact that the area cannot be effectively used.

The barrier layer 116 is a layer for separating the adjacent pixels, and it prevents the short circuit failure at the ends of the translucent electrodes 113-115 for the light emitting element. The configuration of an organic compound layer suitable in this form is a configuration in which conductive polymer 117 such as PEDOT/PSS or the like is coated on the whole surface, and on which, the organic compound layer 118 containing the light emitting layer has been formed. In this case, as for the thickness shape of the conductive polymer 117, it is thin at the upper portion due to the influence of the barrier 116, it is thick at the end portions of the barrier 116 (i.e., contact portion of barrier layer and translucent electrode). Owing to this, the resistance to the lateral direction at the upper portion of the barrier layer becomes high, the crosstalk can be prevented. Furthermore, since it is thick near the relevant end portions, the electric field focusing is relaxed, and the deterioration from the pixel end portions can be prevented. Moreover, here, a conductive polymer such as PEDOT/PSS or the like is used, thereby improving the hole injection property and enhancing the emission efficiency.

Then, as for the light emitting elements 15, 25 and 35, the wirings 110-112 penetrate through the coloring layers 107-109 and the flattened insulating films 105, 106, and are connected to the TFTs 13, 23 and 33, respectively.

Furthermore, on the non-translucent electrode 119, the protective film 120 is covered with silicon nitride or diamond like carbon, hydrogenated or halogenated amorphous carbon (a-C:H) film, amorphous silicon (a-Si) film, diamond like carbon (DLC) film, amorphous silicon nitride film or the like, these coating films are formed by a plasma CVD method, the drawback can be compensated by hydrogenating or halogenating the organic compound layer with hydrogen or halogen in the plasma, and can be stabilized as well.

The light emitted from the light emitting element transmits through the coloring layer of color filter, is radiated from the substrate 101 and can be visually recognized. A variety of substrates are capable of being applied if the substrate transmits the emitted light. As for a glass, a transparent glass such as no-alkali glass commercially available or the like is preferable, an alkali glass in which its surface is covered with silicon oxide film can be also applied. In the case where a plastic is used, polyethylene naphthalate(PEN), polyethylene terephthalate(PET), polyethersulfone(PES), translucent polyimide and the like can be applied. Besides these, a transparent ceramic such as a translucent alumina, ZnS sintered body and the like can be also applied. The form of the substrate may be available in any form of a plate shaped matter, a film shaped matter and a sheet shaped mater, and it may have either a monolayer structure or a laminated structure.

In the case where an organic compound layer having a luminous property emits the light, the spectrum comparatively distributes over a wide wavelength range, and the color purity is lowered. For the purpose of correcting this, the color purity is capable of being enhanced by utilizing the color filter. Needless to say, in the case where the light emitting element emits white color, the color display can be performed by utilizing this color filter. Furthermore, by providing color filters, thereby it prevents the pixel from becoming a mirror surface by light reflection of non-translucent electrode in the light emitting device in the form shown in FIG. 5.

Figure 4:
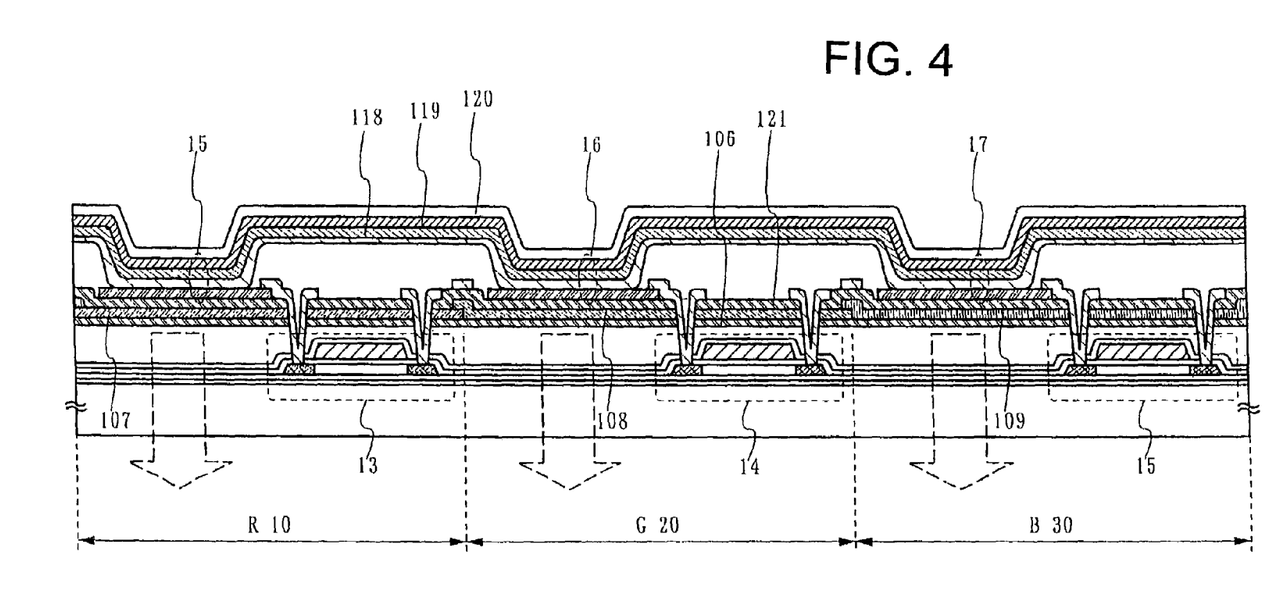
FIG. 4 is a vertical section showing the configuration of a light emitting device equipped with a color filter coloring layer of the present invention.

FIG. 4 shows an example in which the insulating film 121 with barrier property has been formed on the coloring layers 107-109 in the configuration of FIG. 1. By forming the insulating film 121 having the barrier property on the coloring layers, the coloring layers is not easily scarred in the steps thereafter, and the deterioration of the element due to the diffusion of the pigment component into the light emitting element can be prevented.

On the other hand, the boundary region of the surface of the coloring layers of color filter in which fine projections and the coloring layers adjacent each other are overlapped is thickened than other regions, and convex portions are formed. Particularly, if the former exists in the light emitting element formation region, that is, within the pixel surface, the adverse phenomenon such as short circuit failure, black speck failure and the like occurs, particularly in the case where a display screen with a high definition is formed, that becomes a causing factor of lowering the display quality.

Figure 2A:
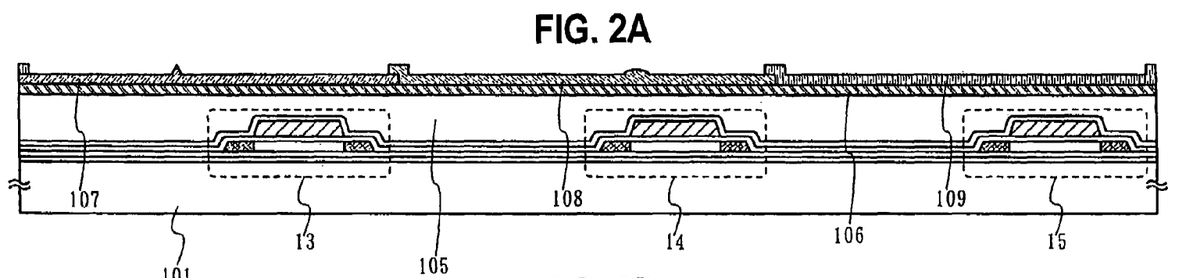
FIGS. 2A and 2B are vertical sections showing the fabricating steps of a light emitting device equipped with a color filter coloring layer of the present invention.
Figure 2B:
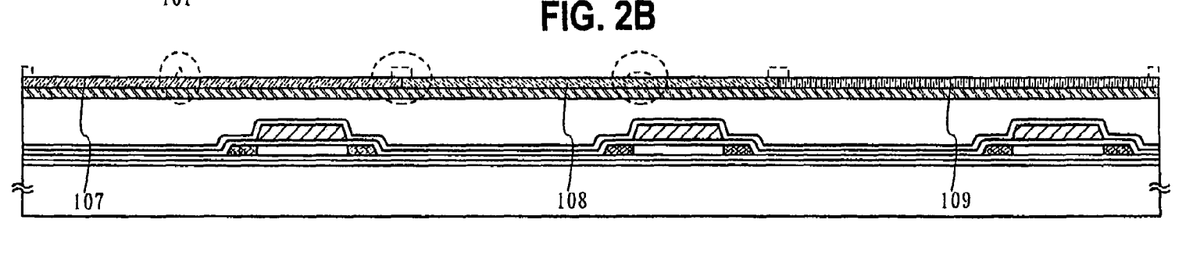

FIG. 2A shows the state where the coloring layers 107-109 have been formed on the flattened insulating film 105 with an inorganic or organic insulating material and the insulating film 106 having the barrier property, the above-described projections and convexes have been formed. In order to remove the above-described projections and convexes, it is desirable that after the coloring layers have been formed, the projections and convexes are removed by utilizing mechanical polishing, and chemical mechanical polishing using slurry or the like. FIG. 2B shows the state after the polishing.

In this state, the test for detecting a pin hole, cracking, notch, pattern deviation and the like of the coloring layers is carried out, and the defectives are selected and the reprocessing can be carried out.

Figure 3A:
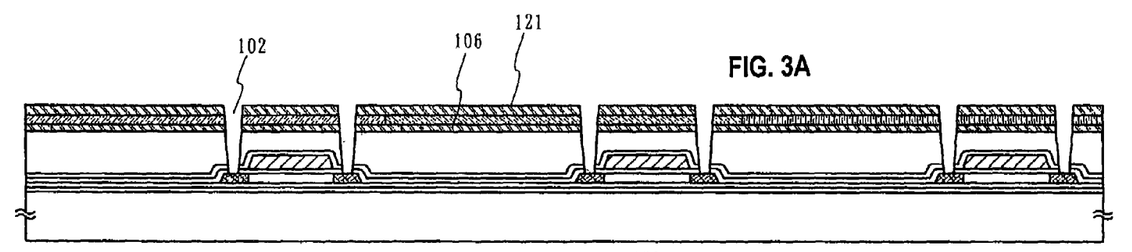
FIGS. 3A and 3B are vertical sections showing the fabricating steps of a light emitting device equipped with a color filter coloring layer of the present invention.

Subsequently, as shown in FIG. 3A, the inorganic insulating film 121 having the barrier property formed with silicon nitride or the like is formed by a high frequency sputtering method which targets silicon. By forming this silicon nitride film, the impurities such as pigment or the like contained in the coloring layers are diffused in the organic compound layer of the light emitting element, thereby preventing the element characteristics from deteriorating.

Figure 3B:
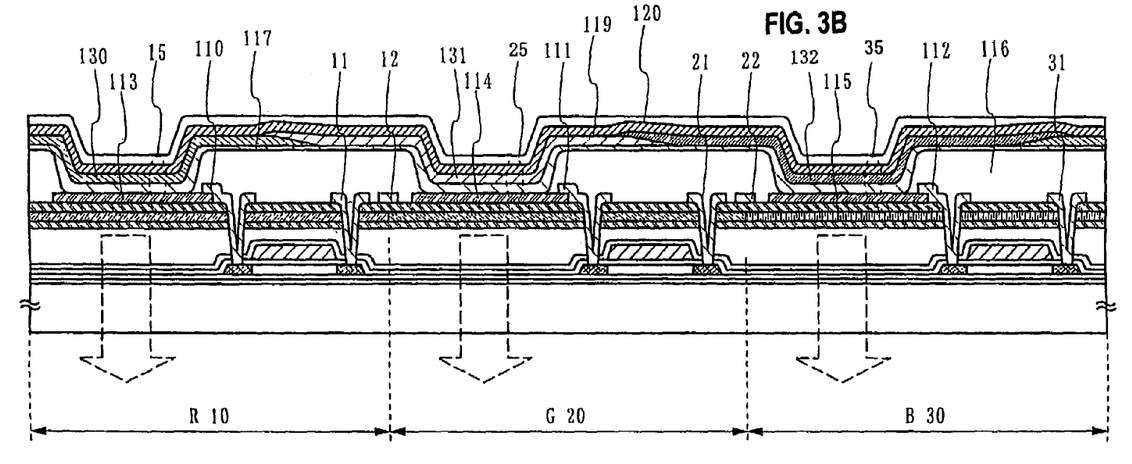

FIG. 3B shows the state where the light emitting element has been formed, and the configuration is similar to that of FIG. 1 except that the organic compound layer 118 containing the light emitting layer formed on the conductive polymer 117 such as PEDOT/PSS or the like may be individually formed as the organic compound layer for the red color emission 130, the organic compound layer for green color emission 131, and the organic compound layer for blue color emission 132. Noted that the configurations of the non-translucent electrode (cathode) 119 and the protective film 120 are similar to those of FIG. 1.

As described above, in the present invention, a light emitting device is integrally formed by combining a TFT, a color filter and a light emitting element on the substrate, the highest temperature in the processes is a temperature of about 600° C. at which a semiconductor layer which is a configuring member of a TFT is crystallized, or 350-450° C. at which hydrogenation is performed, that is, performed prior to the formation of the flattened film. Therefore, the coloring layer of color filter whose heat resistance is solely about 200° C. can be prepared without any problem. Moreover, a high definition light emitting device capable of reducing the manufacturing cost can be provided without integrating the yield of TFT steps and color filter steps.

What is claimed is:
1. A light emitting device comprising:
an insulating film formed over a substrate;
a color filter formed over said insulating film, said color filter comprising at least first, second, and third coloring layers wherein the first coloring layer is located between the second and third coloring layers;
a light emitting element comprising a conductive polymer and a light emitting layer comprising an organic compound wherein the conductive polymer and the light emitting layer are provided between first and second electrodes and over said first coloring layer; and
a barrier layer covering ends of the first electrode,
wherein a boundary region of coloring layers adjacent each other is formed, and
wherein the barrier layer overlaps said boundary region,
wherein the conductive polymer is formed over the barrier layer, and
wherein a first portion of the conductive polymer formed in contact with the first electrode is thicker than a second portion of the conductive polymer formed over the barrier layer.

2. A light emitting device as claimed in claim 1, wherein an emission of said light emitting element is radiated through said first coloring layer.

3. A light emitting device as claimed in claim 1, wherein said first coloring layer is in direct contact with said second and third coloring layers.

4. A light emitting device as claimed in claim 1, further comprising a thin film transistor formed over the substrate.

5. A light emitting device comprising:
a light emitting element provided in a pixel section in a matrix shape, said light emitting element comprising a conductive polymer and a light emitting layer comprising an organic compound wherein the conductive polymer and the light emitting layer are provided between a pair of a translucent electrode and a non-translucent electrode;
a color filter formed corresponding to each pixel, said color filter comprising at least first, second, and third coloring layers wherein the first coloring layer is located between the second and third coloring layers, and formed in contact with an insulating film, and formed between said light emitting element and said insulating film;
a barrier layer covering ends of the translucent electrode; and
a signal line overlapping a boundary region of coloring layers adjacent to each other,
wherein the barrier layer overlaps said boundary region, and wherein a first portion of the conductive polymer formed in contact with the translucent electrode is thicker than a second portion of the conductive polymer formed over the barrier layer.

6. A light emitting device as claimed in claim 5, wherein an emission of said light emitting element is radiated through said first coloring layer.

7. A light emitting device as claimed in claim 5, wherein said first coloring layer is in direct contact with said second and third coloring layers.

8. A light emitting device as claimed in claim 5, further comprising a thin film transistor formed over the substrate.

9. A light emitting device comprising:
an insulating film formed over a substrate;
a color filter formed over said insulating film, said color filter comprising at least first, second, and third coloring layers wherein the first coloring layer is located between the second and third coloring layers;
a light emitting element comprising a conductive polymer and a light emitting layer comprising an organic compound wherein the conductive polymer and the light emitting layer are formed between first and second electrodes and over said insulating film; and
a barrier layer covering ends of the first electrode,
wherein a first portion of the conductive polymer formed in contact with the first electrode is thicker than a second portion of the conductive polymer formed over the barrier layer.

10. A light emitting device as claimed in claim 9, wherein said light emitting element is formed over said first coloring layer.

11. A light emitting device as claimed in claim 9, wherein a boundary region of coloring layers adjacent each other is formed, and
wherein the barrier layer overlaps said boundary region.

12. A light emitting device as claimed in claim 9, wherein said first coloring layer is in direct contact with said second and third coloring layers.

13. A light emitting device as claimed in claim 9, wherein an emission of said light emitting element is radiated through said first coloring layer.

14. A light emitting device as claimed in claim 9, wherein a signal line overlaps a boundary region of coloring layers adjacent each other.

15. A light emitting device as claimed in claim 9, further comprising a thin film transistor formed over the substrate.

16. A light emitting device comprising:
an insulating film formed over a substrate;
a color filter formed over said insulating film, said color filter comprising at least first, second, and third coloring layers wherein the first coloring layer is located between the second and third coloring layers;
a light emitting element formed over said insulating film, said light emitting element comprising at least first, second, and third light emitting layers, and a conductive polymer wherein the first light emitting layer is located between first and second electrodes;
a barrier layer covering ends of the first electrode,
wherein the first, second, and third light emitting layers comprise an organic compound,
wherein a first portion of the conductive polymer formed in contact with the first electrode is thicker than a second portion of the conductive polymer formed over the barrier layer.

17. A light emitting device as claimed in claim 16, wherein said light emitting element is formed over said first coloring layer.

18. A light emitting device as claimed in claim 16, wherein a boundary region of coloring layers adjacent each other is formed, and
wherein the barrier layer overlaps said boundary region.

19. A light emitting device as claimed in claim 16, wherein said first coloring layer is in direct contact with said second and third coloring layers.

20. A light emitting device as claimed in claim 16, wherein an emission of said light emitting element is radiated through said first coloring layer.

21. A light emitting device as claimed in claim 16, wherein a signal line overlaps a boundary region of coloring layers adjacent each other.

22. A light emitting device as claimed in claim 16, further comprising a thin film transistor formed over the substrate.

* * * * *